United States Patent [19]

Ohno et al.

[11] Patent Number: 5,565,864
[45] Date of Patent: Oct. 15, 1996

[54] ABSOLUTE ENCODER

[75] Inventors: Kou Ohno, Zama; Tadashi Horikawa, Kawasaki; Toru Morita; Yuuji Yamazaki, both of Yokohama, all of Japan

[73] Assignee: Nikon Corporation, Tokyo, Japan

[21] Appl. No.: 299,445

[22] Filed: Sep. 1, 1994

[30] Foreign Application Priority Data

Sep. 2, 1993 [JP] Japan .................................. 5-242044
Sep. 14, 1993 [JP] Japan .................................. 5-252388

[51] Int. Cl.$^6$ .................................................. H03M 1/22
[52] U.S. Cl. ............................. 341/1; 341/11; 341/3
[58] Field of Search .................................. 341/1, 11, 13, 341/3, 4; 250/231.18

[56] References Cited

U.S. PATENT DOCUMENTS 5,438,330  8/1995  Yamazaki .................................. 341/11

FOREIGN PATENT DOCUMENTS 57-175211  10/1982  Japan .
63-231215  9/1988  Japan .

*Primary Examiner*—Jeffrey A. Gaffin
*Assistant Examiner*—Peguy JeanPierre

[57] ABSTRACT

An encoder includes a code plate, a detector, a transformer, and first and second calculators. The code plate is formed with an absolute pattern including a plurality of bit patterns, each bit pattern formed by a predetermined number of bits and representing one absolute position. The detector moves relatively with respect to the code plate, has a plurality of detecting elements arranged to be opposed to the predetermined number of bits, and reads the bit pattern from the absolute pattern to output a bit pattern signal representing the bit pattern. The transformer can transform only specific bit pattern signals corresponding to specific bit patterns out of a plurality of the bit pattern signals corresponding to the plurality of bit patterns, into the absolute positions. The first calculator calculates a relative, positional relation between the bit pattern corresponding to the bit pattern signal, read from the detector, and the specific bit pattern. The second calculator calculates information indicating a position of the code plate relative to the detector, based on the absolute position obtained by the transformer and the relative, positional relation obtained by the first calculator.

12 Claims, 7 Drawing Sheets

```
INPUT      X4    X3    X2    X1    X0
OUTPUT     Y2    Y1    Y0
NOT   /  ;   OR  +  ;   AND  &

Y2   = /X3   &  /X2   &   X1
     +  X4
     +  X3   &  /X1
     +  X2   &  /X1
     +  X3   &   X2
     +  X1   &  /X0

Y1   =  X2   &  /X1
     +  X4   &   X0
     + /X2   &   X1
     +  X3
     + /X4   &   X1

Y0   =  X4   &   X2
     +  X4   &   X1
     +  X1   &   X0
     +  X3   &   X1
     +  X3   &  /X0
```

ABSOLUTE ENCODER

BACKGROUND OF THE INVENTION

1. Field of the Invention

The present invention relates to an absolute encoder, and more particularly to a transformation means for transformation into absolute position from an absolute pattern.

2. Related Background Art

Examples of conventional absolute encoders for transformation into absolute position from an absolute pattern, for example, of maximum-length linear feedback shift register sequence (M-sequence) are the absolute encoders disclosed in Japanese Patent Application Laid-open Nos. 57-175211 and No. 63-231215.

The absolute encoder disclosed in Japanese Patent Application Laid-open No. 57-175211 has a ROM as means for transformation into absolute position, with which each absolute signal detected is directly transformable into an absolute position corresponding to a position of the detection. In other words, all detection positions representing respective absolute positions are made transformable into absolute position, using the ROM, which is a look-up table for transformation from detected data into one of the absolute positions.

On the other hand, the absolute encoder as disclosed in Japanese Patent Application Laid-open No. 63-231215 is so arranged that a reference M-code generating circuit is first cleared, then to output different M-codes one by one at every input of one clock pulse until the output reaches an M-code (m) corresponding to a rotational position (θ) of a code plate.

When the reference M-code generating circuit outputs the M-code (m) corresponding to the rotational position (θ), a counter counts the number of clock pulses supplied before the output of the M-code (m), whereby it can be determined that the M-code (m) should correspond to the rotational position (θ).

As described above, the conventional absolute encoders performed the transformation into absolute position, using the ROM, or the pattern generating circuit such as the reference M-code generating circuit in the above prior art application.

In case of the former using the ROM for transforming all detection positions into the absolute positions, the necessary ROM capacity becomes larger as the pulse number (the number of minimum read units) of the absolute encoder increases. For example, a change from $2^n$ pulses to $2^{n+1}$ pulses makes the capacity of the ROM $2 \cdot (n+1)/n$ times larger. If circuits of the absolute encoder are constructed of a semicustom IC such as a gate array, most gates of the semicustom IC are used up for the ROM portion for transformation into absolute position while few of them can be used for the control unit of the encoder. Thus, a problem was that the semicustom IC could not be used with good efficiency.

Further, in case of the latter using the pattern generating circuit for transformation into absolute position, the time necessary for transformation into absolute position has great variations depending upon a positional relation between the reference position and the detection position. For example, in case of an absolute encoder of 2048 pulses with clock 1 MHz, the necessary time is 1 μs at minimum and 2.048 ms at maximum. Thus, there was a problem that if the absolute encoder was used to control a motor or the like, the difference in the necessary time was too large to execute a stable control.

SUMMARY OF THE INVENTION

The present invention has been accomplished under the above-described circumstances, and an object of the present invention is to provide an absolute encoder which can reduce the ROM capacity for transformation into absolute position and the variations in time necessary for transformation into absolute position.

According to the first aspect of the invention, solving the above problems, there is provided an absolute encoder comprising a code plate formed with an absolute pattern having a plurality of bit patterns, each bit pattern consisting of a predetermined number of bits and representing one absolute position; detecting means relatively moving to said code plate, having a plurality of detecting elements opposed to a bit pattern of said predetermined number of bits, and reading said absolute pattern to output a bit pattern signal; absolute position transforming means which can transform, among a plurality of bit pattern signals corresponding to the plurality of bit patterns, only specific bit pattern signals corresponding to specific bit patterns into absolute positions; pattern signal changing means for successively changing the bit pattern signals until the bit pattern signal read by the detecting means coincides with one of the specific bit pattern signals transformable by the absolute position transforming means; and calculating means for calculating information on a position of said code plate relative to said detecting means, based on the transformable bit pattern signal and a number of changes effected by said pattern signal changing means.

According to a preferable aspect, the pattern signal changing means changes the bit pattern signals in accordance with the order of the arrangement of the bit patterns formed in the absolute pattern. Also, the absolute position transforming means is preferably provided with determining means for determining whether or not the bit pattern is transformable, referring to part of bits in the bit pattern.

In the absolute encoder of the present invention, an absolute signal (hereinafter referred to simply as "pattern") consisting of a numeric array of binary numbers is detected at a position where the detector is opposed to the absolute pattern. Here, the absolute position transforming means is so arranged that only a plurality of specific patterns are directly transformable into absolute position. In such an absolute encoder, the absolute position transforming means first determines whether or not the detected pattern is directly transformable into absolute position. If it is transformable, the transformed absolute position can be considered as the absolute position for the detection position. On the contrary, unless it is transformable, using the detected pattern as an initial value of the pattern generating circuit, the generating circuit successively generates patterns while shifting one by one in a predetermined direction along the absolute pattern in synchronization with clock signals. The thus generated patterns each are subjected to the judgment as to whether or not each pattern is directly transformable into absolute position in the absolute position transforming means, repeating the operation. When a generated pattern comes to coincide with one of the above-described transformable specific patterns, the absolute position corresponding to the transformable pattern is eventually obtained. The absolute position for the detection position can be finally attained by some calculation of the absolute position of the pattern and the number of changes, for example, by calculation such as addition or subtraction. Whether subtraction or addition should be used depends upon the direction of shift.

According to the second aspect of the invention, solving the above problems, there is provided an absolute encoder comprising a code plate formed with an absolute pattern in which one absolute position is represented by an n-bit pattern, the absolute pattern consisting of a number P ($2^{n-1} < P \leq 2^n$, where n is a positive integer) of minimum read units; detecting means relatively moving to the code plate, having (n+m) (where m is an integer of not less than 1) detecting elements opposed to the absolute pattern, and reading the absolute pattern to output an (n+m)-bit signal; absolute position transforming means for making specific n-bit pattern signals corresponding to specific n-bit patterns among (n+m)-bit signals transformable into absolute positions; signal extracting means for extracting an n-bit signal from the (n+m)-bit signal, the signal extracting means successively extracting the n-bit signals until one n-bit signal comes to coincide with one of said specific n-bit pattern signals transformable by said absolute position transforming means; and calculating means for calculating information on a position of the code plate relative to the detecting means, based on said transformable n-bit signal and the number of extractions effected by the signal extracting means.

According to a preferable aspect, the signal extracting means selects the n-bit signal in accordance with the order of the arrangement of patterns formed in the absolute pattern.

In the absolute encoder according to the second aspect of the present invention, an absolute signal consisting of a numeric array of (n+m) binary numbers is detected from P ($2^{n-1} < P \leq 2^n$) absolute data. Among (m+1) n-bit patterns included in the detected numeric array of (n+m) binary numbers, at least one n-bit pattern is arranged as directly transformable into absolute position. Thus obtained are the absolute position a of the transformable n-bit pattern and a relative position k of the transformable n-bit pattern relative to the detection position in the detected data.

Based on the thus obtained relative position information k ($0 \leq k \leq m$) of the transformable n-bit pattern and the absolute position information a of the transformable n-bit pattern, the absolute position a−k for the detection position can be obtained, for example, by executing the calculation of a−k.

As described above, the absolute encoders according to the first and second aspects of the present invention are so arranged that all detection positions are not directly transformable into absolute position but only certain specific detection positions are directly transformable into absolute position. Accordingly, the capacity of ROM can be controlled within a desired range by properly limiting the number of n-bit patterns which are directly transformable into absolute position.

Further, the maximum time necessary for obtaining an absolute position for a detection position depends upon intervals of the patterns transformable into absolute position. In other words, the variations of the necessary time for transformation into absolute position can be controlled within a desired range by properly securing the number of patterns directly transformable into absolute position and arranging them at substantially equal intervals.

BRIEF DESCRIPTION OF THE DRAWINGS

FIG. 2 is a drawing to show an example of an M-sequence absolute pattern;

FIG. 3 is a drawing to show 5-bit patterns which are transformable into absolute position in ROM 7 in FIG. 1, and corresponding absolute positions;

FIG. 4 is a drawing to show 5-bit patterns which are transformable into absolute position in ROM 17 in FIG. 6, and corresponding absolute positions;

FIG. 5 is a drawing to show the contents of transformation into absolute position as executed as an exceptional treatment in the second embodiment;

FIG. 10 shows a logical equation for the logical compression in the fourth embodiment.

DETAILED DESCRIPTION OF THE PREFERRED EMBODIMENTS

First, embodiments according to the first aspect of the present invention will be described with reference to the accompanying drawings.

Figure 1:
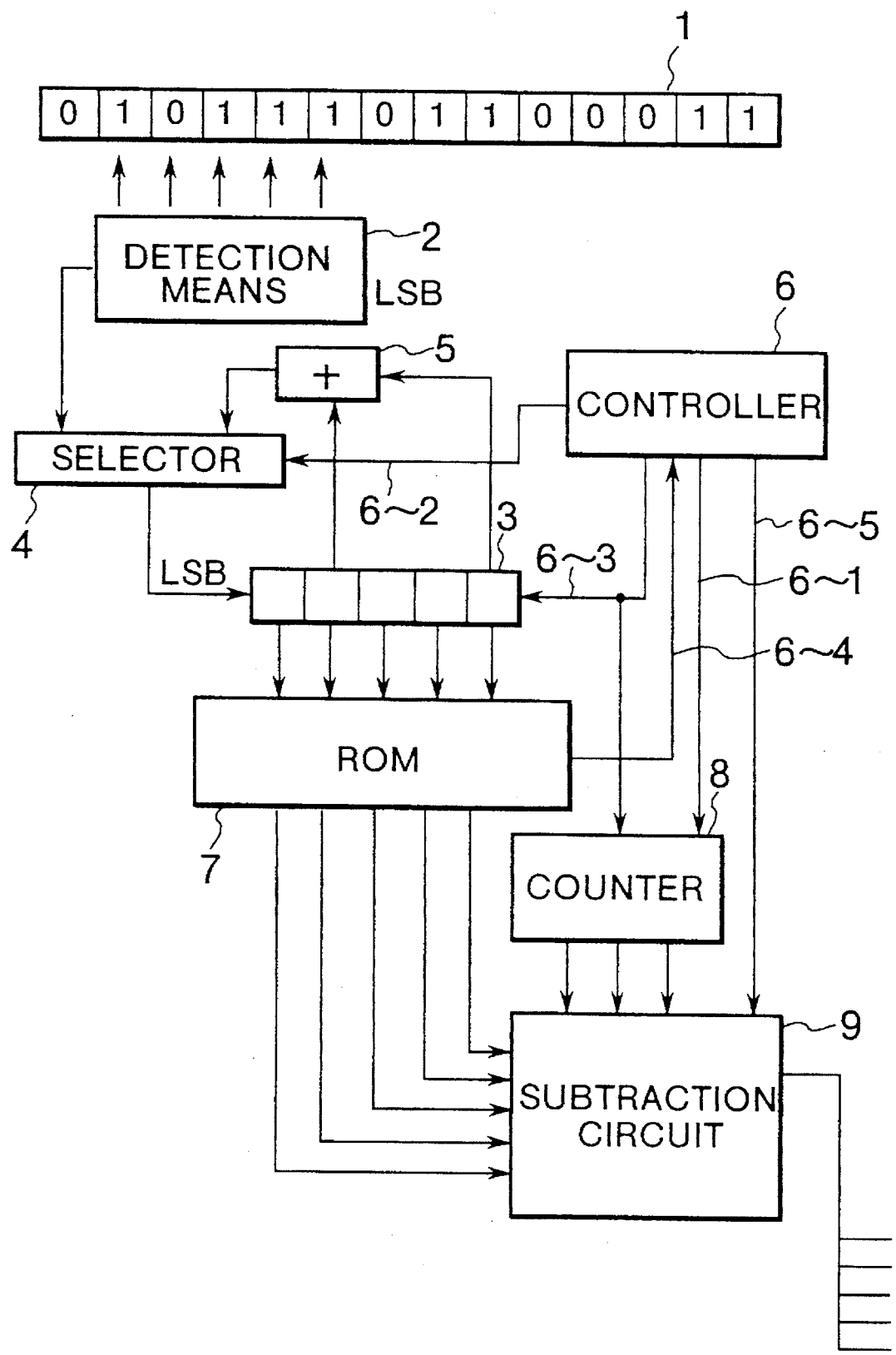
FIG. 1 is a block diagram to schematically show the structure of an absolute encoder according to the first embodiment of the present invention.

FIG. 1 is a block diagram to schematically show the structure of an absolute encoder of the first embodiment of the present invention. Further, FIG. 2 shows an absolute pattern generated from a generating polynomial of $X^5 + X^3 + X^0$, which is a pattern obtained by inserting a "0" into a portion of four continuous "0"s in an M-sequence (maximum period sequence) pattern of degree 5. In other words, the absolute pattern of FIG. 2 is a numeric array consisting of $2^5 = 32$ binary numbers, thus having 32 read patterns.

The absolute encoder of FIG. 1 is provided with a code displaying means 1 in which the absolute pattern of FIG. 2 is formed. FIG. 1 shows only part of the absolute pattern of FIG. 2. The code displaying means 1 has a binarized pattern, for example indicating 1 for interruption of light and 0 for transmission of light if it is of an optical type.

The absolute encoder as shown is further provided with a detecting means 2 for reading pattern information in the code displaying means 1 to convert (or binarize) it into a digital signal. The detecting means 2 is composed of five detecting elements, for example, such as a photodiode array, and an output of the detecting means 2 is connected through a selector 4 to the LSB of a shift register 3.

Further, an exclusive OR output circuit 5 receives data of MSB and data of $2^1$ bit in the shift register 3, and an output thereof is connected through the selector 4 to the LSB of the shift register 3. Further, parallel outputs of the shift register 3 are connected to a ROM 7, and parallel outputs of ROM 7 are connected to a subtraction circuit 9. The selector 4 and shift register 3 are arranged to be controlled by a controller 6.

An output of the controller 6 is connected to a counter 8, and parallel outputs of the counter 8 are connected to the subtraction circuit 9. The subtraction circuit 9 is connected to the controller 6 by a signal line 6-5 and is arranged to be controlled by the controller 6. In more detail, the subtraction circuit 9 receives through the signal line 6-5 a data output signal from the controller 6 receiving a transformable signal H (which is a signal representing that data is transformable into absolute position) from the ROM 7, and outputs final data only upon reception of the data output signal.

The ROM 7 is so arranged that among the 32 read pattern signals, eight types of pattern signals of 5-bit numeric arrays shown in FIG. 3 are directly transformable into absolute position. In other words, the eight types of pattern signals of 5-bit numeric arrays shown on the left side in the drawing can be transformed in the ROM 7 into the absolute positions listed on the right side in the drawing.

Also, the shift register 3 is so arranged that it can successively generate 5-bit array patterns as shifted bit by bit to the right in FIG. 1 from the detected 5-bit array pattern in synchronization with clock.

Specifically described below is the operation of the absolute encoder of the present embodiment constructed as described above.

Out of the absolute pattern in the code displaying means 1, the five detecting elements in the detecting means 2 read a pattern portion opposed thereto to binarize it. Then the detected data by the detecting means 2, i.e., a numeric array of binary numbers of 10111 in FIG. 1, is sent from the MSB side under an instruction of controller 6 through the selector 4 to the shift register 3. In more detail, starting from bit data on the left side in the drawing or on the MSB side of the detecting means 2, the bit data is loaded in order in the shift register 3 from the MSB side thereof. Thus, there is the detected data 10111 put in the shift register 3 from the right side (MSB side) in the drawing.

The detected data 10111 (LSB) output in parallel from the shift register 3 is put into an address bus of ROM 7, and the controller 6 clears the counter 8 through an output line 6-1. In the ROM 7 it is determined whether or not the 5-bit array pattern signal thus input is directly transformable into absolute position. Namely, it is checked whether the detected data 10111 in the address bus coincides with one of the transformable patterns on the left side in FIG. 3. As seen from FIG. 3, the detected data 10111 is not transformable into absolute position in the ROM 7. Then the ROM 7 outputs an untransformable signal L (which is a signal representing that the data is untransformable into absolute position) through an output line 6-4 to the controller 6.

When the controller 6 receives the untransformable signal L from the ROM 7, it changes over the selector 4 through an output line 6-2 to put an exclusive OR between data of MSB and data of $2^1$ in the shift register 3, produced by the exclusive OR output circuit 5 through the selector 4 into the LSB of shift register 3. In this case, because the data of MSB is 1 and data of $2^1$ is 1, the exclusive OR output circuit 5 produces 0 as the exclusive OR. Accordingly, in the shift register 3 the data of LSB becomes 0 and the other bit data is shifted one bit to the MSB side, finally giving 01110 from the MSB side.

The controller 6 also outputs a clock signal through an output line 6-3 to the shift register 3 and to the counter 8.

As described, the shift register 3 generates the generated data of 01110 with the first clock signal. Repeating the above processes, the generated data by the shift register 3 changes as 11101, 11011, 10110, and so on in order in synchronization with a second and subsequent clock signals, respectively. The change of the generated data coincides with a pattern change appearing as the absolute pattern of FIG. 1 is shifted bit by bit to the right from the detected data 10111.

In the above pattern change, neither none of the generated data 01110, 11101, and 11011 generated by the shift register 3 in synchronization with the first to third clock signals are transformable into absolute position in the ROM 7. On the other hand, the generated data 10110 generated by the shift register 3 in synchronization with the fourth clock signal is transformable into absolute position, and then the ROM 7 outputs the transformable signal H through the output line 6-4 to the controller 6. On this occasion, the ROM 7 outputs the value 01011 of absolute position information a corresponding to the transformable generated data 10110 (as seen on the fourth line in FIG. 3), which is 11 as a decimal number, through the data bus to the subtraction circuit 9.

On the other hand, the counter 8 counts "4", which is a number of shifts executed by the shift register 3. The count value "4" indicates that the transformable pattern is located 4 bits to the right in the drawing from the detected data 10111, that is, the count value represents relative position information k of the transformable pattern relative to the detection position. The count of the counter 8 is put into the subtraction circuit 9.

Receiving the absolute position information a=11 from the ROM 7 and the relative position information k=4 from the counter, the subtraction circuit 9 calculates a−k=7, finally obtaining an absolute position corresponding to the detected data 10111.

In order to average a number of necessary pattern changes, the absolute positions corresponding to the transformable, specific bit pattern signals should be preferably arranged at equal intervals if possible.

Figure 6:
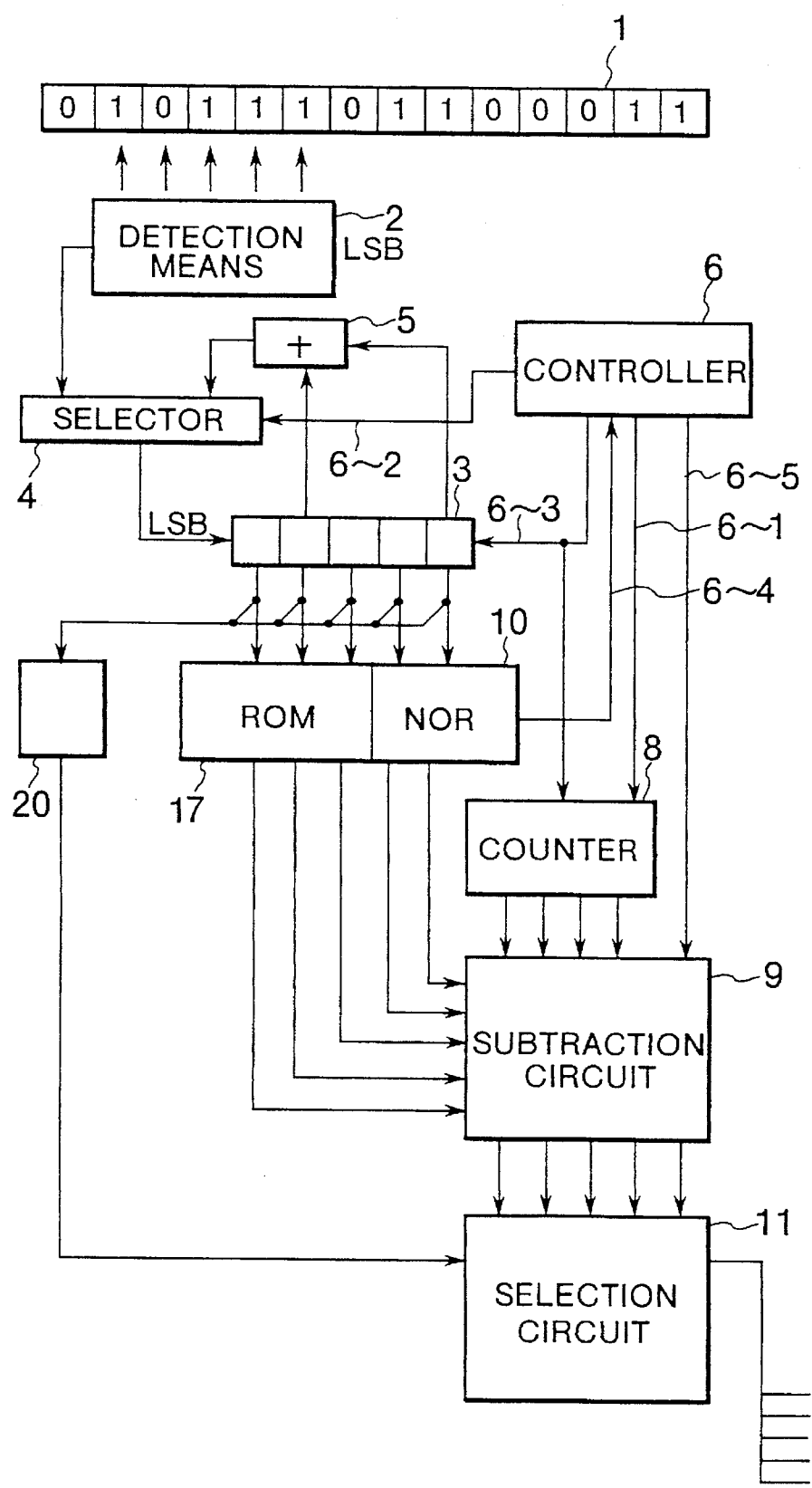
FIG. 6 is a block diagram to schematically show the structure of an absolute encoder according to the second embodiment of the present invention.

FIG. 6 is a block diagram to schematically show the structure of an absolute encoder of the second embodiment of the present invention. The second embodiment is constructed substantially in the same structure as the first embodiment except that a ROM 17 has a built-in NOR circuit 10 and that an exceptional absolute position transforming circuit 20 and a selection circuit 11 are added. In FIG. 6, constituents corresponding to those in FIG. 1 are denoted by the same reference numerals.

More specifically, two data outputs on the MSB side of shift register 3 are connected to the NOR circuit 10 in the ROM 17. Further, outputs of the shift register 3 are connected through the exceptional absolute position transforming circuit 20 to the selection circuit 11. Also, parallel outputs of the subtraction circuit 9 are connected to inputs of the selection circuit 11.

FIG. 4 shows pattern signals transformable into absolute position in the ROM 17 in the second embodiment, and absolute positions corresponding thereto. As seen, eight types of pattern signals starting with "00" from the MSB side are transformable in the second embodiment.

Specifically described in the following is the operation of the absolute encoder of the second embodiment constructed as described above.

From the absolute pattern in the code displaying means 1, a pattern portion opposed to the five detecting elements in the detecting means 2 is read to be binarized. Then the shift register 3 receives the detected data by the detecting means 2, which is a numeric array of binary numbers of detected data 10111 from the MSB side, through the selector 4 under an instruction of the controller 6. Specifically, starting from bit data at the left end in the drawing or on the MSB end of the detecting means 2, the data is loaded in order in the shift register 3 from the MSB side. Thus, the detected data 10111 is put in the shift register 3 from the right side (MSB side) in the drawing.

The detected data 10111 output in parallel from the shift register 3 is put in the address bus of the ROM 17, while the controller 6 clears the counter 8 through the output line 6-1. The NOR circuit 10 outputs an output signal of H only if "00" appears in the two end bits on the MSB side in the detected data in the address bus of the ROM 17, i.e., only if the pattern starts with "00" from the MSB side. The NOR circuit 10 outputs an output signal of L for all other cases. Thus, the output signal H from the NOR circuit 10 is a signal indicating that the pattern is transformable into absolute position in the ROM 17, while the output signal L is a signal indicating that the pattern is untransformable into absolute position.

Since the MSB-side 2 bits are not "00" in the first detected data 10111 in the address bus, the detected data 10111 is untransformable into absolute position in the ROM 17, as seen from FIG. 4. Then the NOR circuit 10 outputs the untransformable signal L through the signal line 6-4 to the controller 6.

When the controller 6 receives the untransformable signal L from the NOR circuit 10, it changes over the selector 4 through the output signal 6-2 to make an exclusive OR between the data of MSB and the data of $2^1$ in the shift register 3, produced by the exclusive OR output circuit 5, put through the selector 4 into the shift register 3. In this case, the data of MSB is 1 and the data of $2^1$ is 1, so that the exclusive OR output circuit 5 produces the exclusive OR of 0.

The controller 6 also outputs a clock signal through the output line 6-3 to the shift register 3 and to the counter 8.

Thus, the shift register 3 generates the generated data of 01110 with the first clock. Repeating the above processes, generated data by the shift register 3 changes as 11101, 11011, 10110, 01100, 11000, 10001, 00011, and so on in order in synchronization with a second and subsequent clock signals. The change of the generated data coincides with a pattern change appearing when the absolute pattern of FIG. 6 is shifted bit by bit to the right in the drawing from the detected data 10111.

In the above pattern change, the generated data 01110, 11101, 11011, 10110, 01100, 11000, and 10001 generated by the shift register 3 in synchronization with the first to seventh clocks all are untransformable in the ROM 7, because none of them starts with "00". On the other hand, the generated data 00011 generated in synchronization with the eighth clock is transformable into absolute position, because it is a pattern starting with "00". Thus, the NOR circuit 10 outputs the transformable signal H to the controller 6. On this occasion, the ROM 17 outputs the value 01111 of absolute position information a corresponding to the transformable generated data 00011 (as seen on the fifth line in FIG. 4), which is 15 as a decimal number, through the data bus to the subtraction circuit 9.

Further, the counter 8 counts "8" as a number of shifts executed by the shift register 3. The count value "8" indicates that the transformable pattern is located 8 bits to the right in the drawing from the detected data 10111, that is, the count value represents relative position information k of the transformable pattern 00011 relative to the detection position. The count of the counter 8 is put into the subtraction circuit 9.

Receiving the absolute position information a=15 from the ROM 17 and the relative position information k=8 from the counter 8, the subtraction circuit 9 calculates a−k=7, finally obtaining an absolute position corresponding to the detected data 10111.

Incidentally, in case of a rotary absolute encoder for converting an angle into a digital code, minimum read units are $(2^n-1)$, using the absolute pattern of the M-sequence pattern. Then, an absolute pattern of $2^n$ pulses is normally formed by inserting a "0" into a portion of (n−1) continuous "0"s.

As a result, for example, in case of the two embodiments as described above, if 00000 is put as detected or generated data into the shift register 3, this special data 00000 cannot generate next generated data to be shifted. In other words, once the data in the shift register 3 becomes 00000, next generated data is also 00000.

Also, if data 10000 one pulse before the data 00000 is put into the shift register 3, generated data is not data 00000 expected as next, but data 00001 following it. In other words, the data 00000 is jumped over, resulting in deviation of absolute position.

As discussed, a pattern to be next generated in the shift direction cannot be produced with input of the data 00000 or the data 10000 one pulse before it into the shift register 3. Therefore, the first embodiment was so arranged that these two patterns were transformable into absolute position in the ROM 7. On the other hand, the second embodiment is so arranged that the data 00000 is transformable into absolute position, but the data 10000 is untransformable into absolute position in the ROM 17 because it is not a pattern starting with "00" from the MSB side.

Accordingly, the second embodiment is provided with the exceptional absolute position transforming circuit 20 as means for executing special transformation of the data 10000 into the corresponding absolute position, so as to perform the transformation into absolute position as shown in FIG. 5. Namely, in case of the data of 10000, the exceptional absolute position transforming circuit 20 performs the transformation into absolute position as an exceptional treatment by means of a combinational circuit or the like, and outputs the value 11111 of the corresponding absolute position to the selection circuit 11.

The reason why the patterns starting with "00" from the MSB side are made transformable into absolute position is as follows. The data 00000 is made always transformable into absolute position. Suppose data starting, for example, with "01" other than "00" from the MSB side is made transformable into absolute position. Then the pattern generating circuit cannot produce the data 00000, which disables the transformation into absolute position when the detected data as read is 00000.

Accordingly, if the data starting with "01" is made transformable into absolute position, the detected data 00000 needs to be transformed into the absolute position by an exceptional treatment, which makes the circuit arrangement complicated.

To avoid such an exceptional treatment, the shift direction needs to be made opposite when the data 10000 is put into the shift register 3 or when the data 10000 is generated in the shift register 3. Specifically, it becomes possible by putting an exclusive OR between the data of LSB and the data of $2^1$ in the shift register 3 into the MSB of shift register 3.

Figure 7:
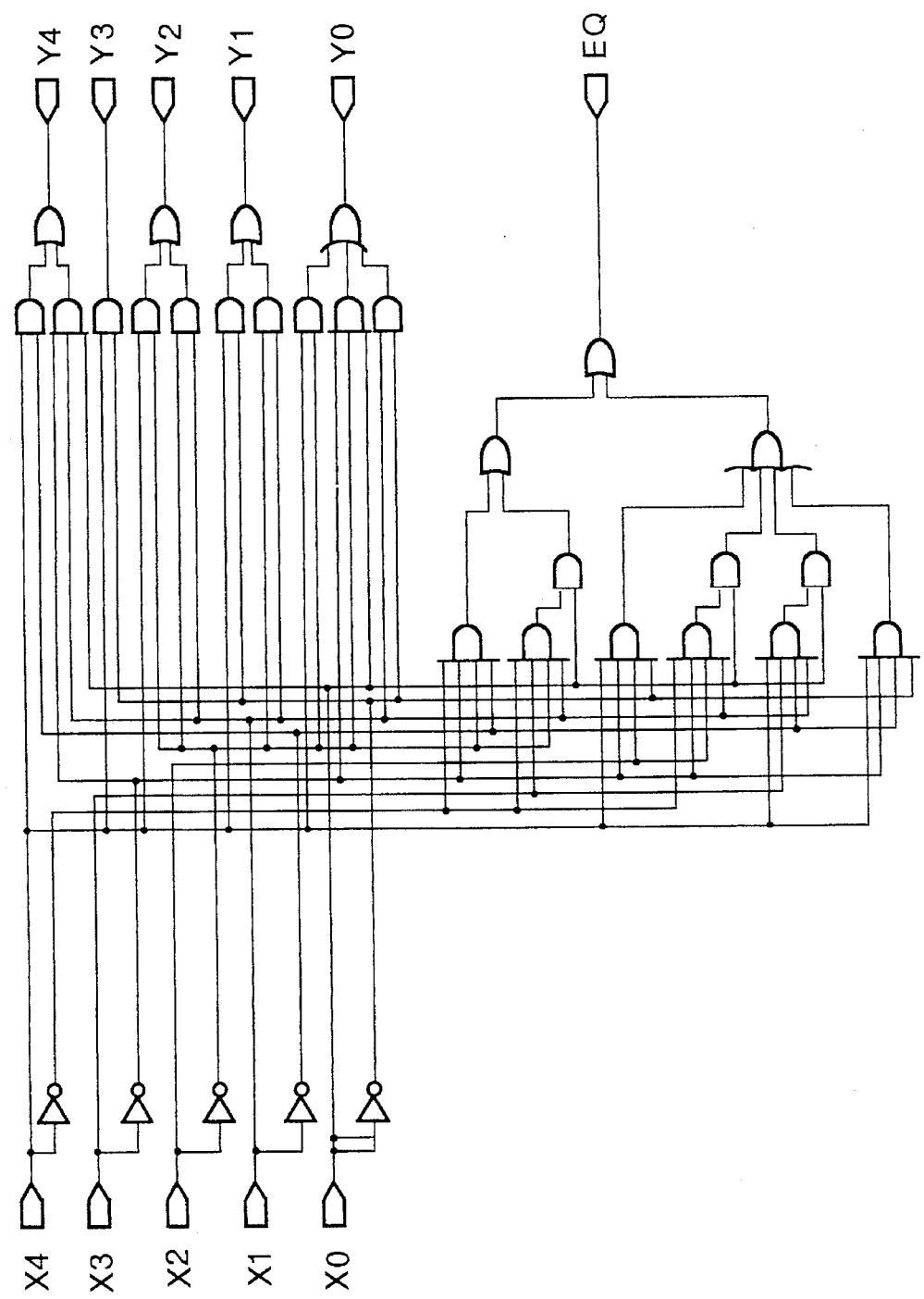
FIG. 7 is a drawing to show a combinational circuit for executing the transformation into absolute position in the ROM 7 in the first embodiment.

FIG. 7 shows the structure of a combinational circuit for executing the transformation into absolute position in the ROM 7 in the first embodiment.

In the combinational circuit as shown, inputs on the left side in the drawing are X4, X3, X2, X1, and X0 arranged in the named order from the top, while inputs on the right side are Y4, Y3, Y2, Y1, Y0, and EQ arranged in the named order from the top. Here, X4 to X0 correspond to respective bits arranged from the MSB side in each of the transformable patterns listed on the left side in FIG. 3. On the other hand, Y4 to Y0 correspond to respective bits arranged from the MSB side in each of the numeric arrays of binary numbers indicating the absolute positions for the transformable patterns, as listed on the right side.

Further, EQ corresponds to the transformable signal H or the untransformable signal L.

The present invention was described with the above embodiments employing the M-sequence absolute pattern as an example, but it is apparent that the present invention can be applied to other general absolute patterns.

Also, the present invention was described with an example of the M-sequence absolute pattern of degree 5 in the above embodiments, but it is clear that the present invention can be applied to absolute patterns of higher degree.

Further, the second embodiment was so arranged that the data 10000 next to the special data 00000 on one side thereof was made transformable into absolute position, but it is possible that the data 00001 adjacent on the other side is made transformable into absolute position, or that the both adjacent data 10000 and 00001 are made transformable into absolute position.

Further, it is noted that the patterns transformable into absolute position do not always have to be arranged at equal intervals and that the smaller the number of the transformable patterns is, the smaller the capacity of ROM can be made.

As described above, the absolute encoders according to the first aspect of the present invention can greatly reduce the capacity of ROM, which is a look-up table for transformation into absolute position from the absolute pattern, to below a quarter and the time necessary for transformation into absolute position to about 10 µs. Therefore, the present invention can achieve compact absolute encoders advantageous in respect of the cost.

Now, embodiments according to the second aspect of the present invention are described in the following.

Figure 8:
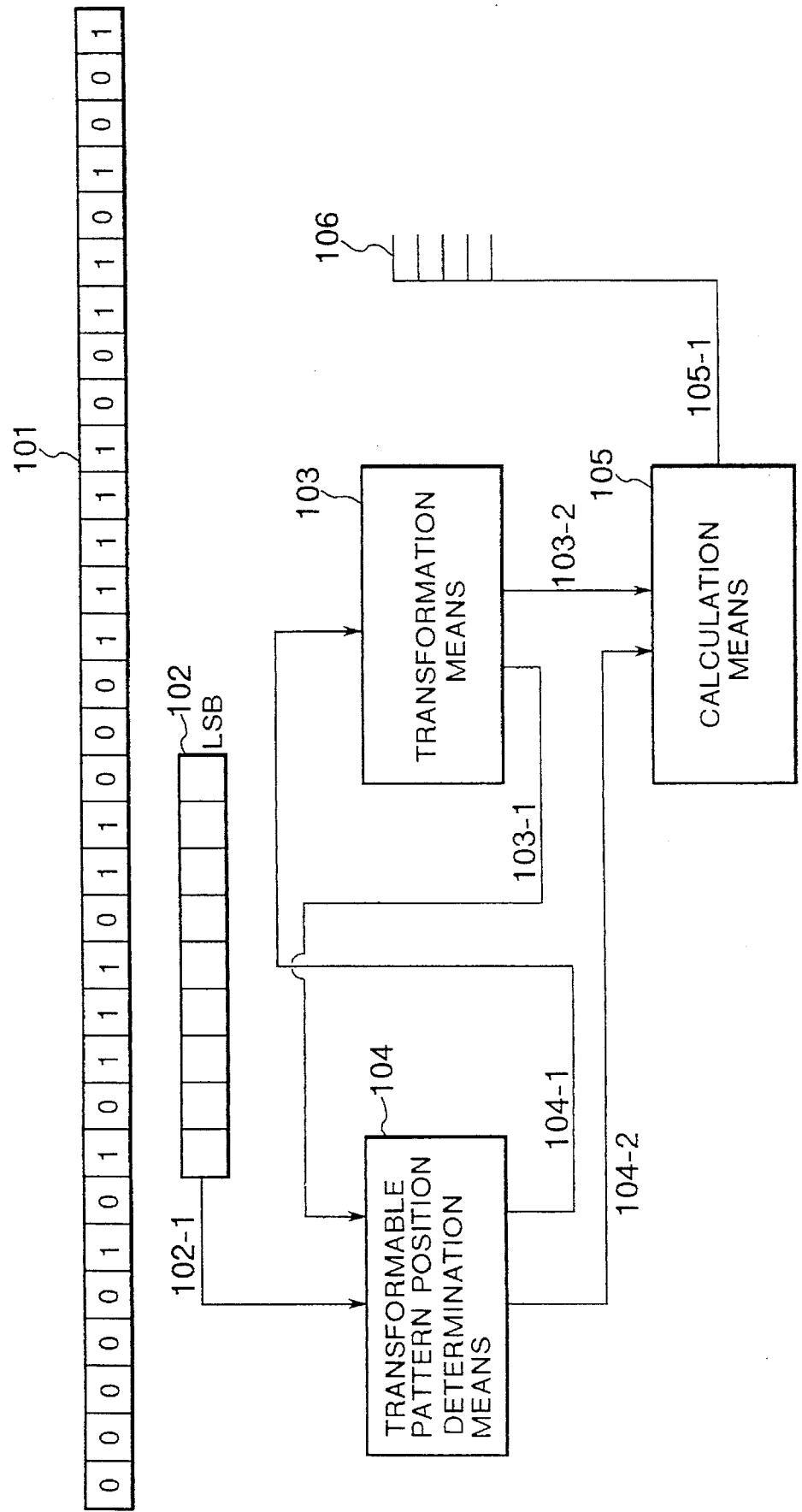
FIG. 8 is a block diagram to schematically show the structure of an absolute encoder according to an embodiment of the present invention.

FIG. 8 is a block diagram to schematically show the structure of an absolute encoder of the third embodiment of the present invention. An absolute pattern employed herein is the absolute pattern generated from the generating polynomial of $X^5+X^3+X^0$ as shown in FIG. 2, which is a pattern obtained by inserting a "0" into a portion of four continuous "0"s in the M-sequence (maximum period sequence) pattern of degree 5.

The absolute encoder of FIG. 8 is provided with a code displaying means 101 in which the absolute pattern of FIG. 2 is formed. The code displaying means 101 has a binarized pattern, for example indicating 1 for interruption of light and 0 for transmission of light if it is of an optical type.

The absolute encoder as shown is further provided with a detecting means 102 for reading pattern information in the code displaying means 101 to convert it into a digital signal. The detecting means 102 is composed of nine detecting elements, for example, such as a photodiode array, and outputs detected data in parallel or in series through an output line 102-1.

The output 102-1 of the detecting means 102 is connected to an input of a transformable pattern position determination means 104. The transformable pattern position determination means 104 successively outputs five types of 5-bit pattern signals each composed of five numbers continuous in the input numeric array of nine binary numbers, through an output line 104-1 to a transformation means 103. In the transformation means 103, patterns transformable into absolute position are the eight types of patterns as listed in FIG. 3, similarly as in the first embodiment. In other words, the transformation means 103 is so arranged that the eight types of 5-bit pattern signals listed on the left side in FIG. 3 are transformable into absolute position and transformed into the corresponding absolute positions as listed on the right side in FIG. 3.

Thus, a value of n is 5, a value of m is 4, and a value of P is 32 in the present embodiment.

The transformation means 103 determines whether or not the input numeric array pattern is directly transformable into absolute position. A determination signal is put through an output line 103-1 to the transformable pattern position determination means 104.

If transformable, the transformation means 103 outputs absolute position information a of the transformable 5-bit pattern through an output line 103-2 to a calculation means 105 while the transformable pattern position determination means 104 outputs relative position information k of the transformable 5-bit pattern through an output line 104-2 to the calculation means 105. Receiving the both position information, the calculation means 105 calculates an absolute position for the detection position and then outputs the calculation result through an output line 105-1 to output 106.

The operation of the absolute encoder of the present embodiment constructed as described above is next described based on a specific numeric array.

Out of the absolute pattern in the code displaying means 101, the detecting means 102 reads a portion of the pattern opposed to the nine detecting elements to binarize it. Then the detecting means 102 sends the detected data, which is a numeric array of binary numbers of 101110110 from the MSB side, through the output line 102-1 to the transformable pattern position determination means 104. The transformable pattern position determination means 104 outputs first five bits from the left, i.e., 10111, out of the 9-bit detected data 101110110 through the output line 104-1 to the transformation means 103 in order to check whether or not the 5-bit data 10111 is directly transformable into absolute position.

As seen from FIG. 3, the 5-bit array pattern signal 10111 is untransformable into absolute position in the transformation means 103. Consequently, the transformation means 103 outputs the untransformable signal L through the output line 103-1 to the determination means.

Receiving the untransformable signal L, the transformable pattern position determination means 104 then outputs second five bits of 01110 starting with the second bit from the left out of the 9-bit detected data 101110110 through the output line 104-1 to the transformation means 103. Since this 5-bit array pattern signal 01110 is also untransformable into absolute position, the transformation means 103 outputs the untransformable signal L through the output line 103-1 to the determination means.

The above processes are repeated hereinafter before one 5-bit signal is determined as transformable into absolute position in the transformation means 103. As described, the transformable pattern position determination means 104 constitutes a signal extracting means for extracting an n-bit signal out of an (n+m)-bit signal and successively extracting n-bit signals until one becomes a transformable specific n-bit pattern signal in the transformation means 103.

In the present embodiment, 5-bit data 10110 starting with the fourth bit from the left end is output through the output line 104-1 to the transformation means 103 in the last place. Since this 5-bit array pattern signal 10110 is transformable into absolute position, the transformation means 103 outputs the transformable signal H through the output line 103-1 to the determination means, and also outputs the value 01011 of absolute position a of the transformable 5-bit pattern (as seen on the fourth line in FIG. 3), which is "11" as a decimal number, through the output line 103-2 to the calculation means 105.

In addition, the transformable pattern position determination means 104 outputs through the output line 104-2 to the calculation means 105 a value of "4", which indicates that the 5-bit array pattern starting with the fourth bit from the left end out of the detected data 101110110 was directly transformable into absolute position, that is, which indicates relative position information k of the transformable pattern relative to the detection position.

Based on the absolute position information "11" of the directly transformable pattern and the relative position information "4" of the transformable pattern, the calculation means 105 calculates an absolute position 11−4=7 of the detection position to output it through the output line 105-1.

As described, the present embodiment is so arranged that the eight types of 5-bit patterns are directly transformed into the absolute positions in the transformation means 103. No problem would arise if a combinational circuit is employed to perform the direct transformation into absolute position, but if a ROM is employed five bits are still needed for the address space, not reducing the capacity of ROM.

Then, as the fourth embodiment of the present invention there is proposed an absolute encoder which can reduce the capacity of ROM to a quarter by logical compression of the eight types of 5-bit patterns into 3-bit patterns so as to reduce the address space to three bits.

A method of logical compression in the absolute encoder of the fourth embodiment may be the method as employed in the second embodiment, employing the arrangement that only the patterns starting with "00" for the two bits from the most significant bit in the 5-bit patterns are made transformable into absolute position, as shown in FIG. 4. Namely, the eight types of 5-bit patterns starting with "00" listed on the left side in the drawing are transformable into absolute position, and are transformed into the corresponding absolute positions listed on the right side in the drawing.

In this case, the 5-bit patterns transformable into absolute position can be immediately logic-compressed into 3-bit patterns simply by deleting the two bits from the most significant bit in the 5-bit patterns. In the ROM the eight types of 5-bit patterns on the left side in FIG. 4 are transformed into the absolute positions on the right side in FIG. 4 only with the three bits from the least significant bit in each 5-bit pattern, which reduces the capacity of ROM to a quarter as compared with the transformation using the 5-bit patterns as they are.

Figure 9:
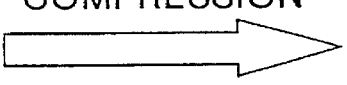
FIG. 9 shows logical compression in the fourth embodiment.

Also, the same effect can be achieved by logical compression using a combinational circuit for such a logical expression that five bits of inputs X4 to X0 can be compressed into three bits of outputs Y2 to Y0, as shown in FIGS. 9 and 10.

In the transformation into absolute position in FIG. 4, the absolute positions are arranged at unequal intervals. For example, the interval between the absolute positions for two transformable patterns adjacent to each other is 12 at maximum between 00011 on the fourth line (which is 3 as a decimal number) and 01111 on the fifth line (which is 15 as a decimal number). Then, the number of necessary detecting elements in the detecting means 102 is 5+12−1=16 in this case.

Thus, the number of detecting elements is likely to increase in case of the second embodiment which can reduce the address space of ROM by arranging the absolute positions at unequal intervals. In order to minimize the number of detecting elements, it is preferred that the transformable 5-bit patterns with "00" as described above be arranged to appear substantially at equal intervals (for example, at the pitch of 5 as in the first embodiment). Generally speaking, specific numeric arrays ("00" in the present embodiment) having a bit number (2 in the present embodiment) which is a binary number representing a number (3 in the present embodiment) 1 smaller than a value obtained when the number P (32 in the present embodiment) of minimum read units is divided by the number (8 in the present embodiment) of transformable specific bit signals, are preferably present substantially at equal intervals of nearly (m+1) pitch (5 pitch in the present embodiment) in the absolute pattern.

Also, transformable 5-bit patterns including specific 2-bit arrays other than "00" may be arranged to appear substantially at equal intervals.

The present invention was described above with the example of the M-sequence absolute pattern in the embodiments according to the second aspect of the present invention, but it is apparent that the present invention can be applied to other general absolute patterns.

Also, the present invention was described with the example of the M-sequence absolute pattern of degree 5 in the above embodiments, but it is clear that the present invention can be applied to absolute patterns of higher order.

Further, the above embodiments included 00000 in the transformable 5-bit patterns, but it is evident that the present invention holds if the transformable pattern is omitted, as seen from the intervals of the absolute positions.

As described above, the absolute encoders according to the second aspect of the present invention can greatly reduce the capacity of ROM, which is a look-up table for transformation into absolute position from the absolute pattern, to below a quarter, and the time necessary for transformation into absolute position to about 2 µs as well. Therefore, the present invention can achieve compact absolute encoders advantageous in respect of the cost.

What is claimed is:

1. An absolute encoder comprising:

a code plate formed with an absolute pattern including a plurality of bit patterns, each bit pattern consisting of a predetermined number of bits and representing one absolute position;

detecting means relatively moving with respect to said code plate, having a plurality of detecting elements arranged to be opposed to said predetermined number of bits, and reading said bit pattern from said absolute pattern to output a bit pattern signal representing said bit pattern;

absolute position transformation means which can transform only specific bit pattern signals corresponding to specific bit patterns out of a plurality of said bit pattern signals corresponding to said plurality of bit patterns, into said absolute positions;

pattern signal changing means receiving said bit pattern signal read from said detecting means, successively changing said bit pattern signal until said bit pattern signal becomes one of said specific bit patterns transformable by said absolute position transformation means, and outputting the transformable bit pattern to said absolute position transformation means; and calculation means for calculating information indicating a position of said code plate relative to said detecting means, based on the absolute position obtained by said absolute position transformation means and a number of changes executed by said pattern signal changing means.

2. An absolute encoder according to claim 1, wherein said pattern signal changing means changes the bit pattern signal successively according to the order of the arrangement of the bit patterns in said absolute pattern.

3. An absolute encoder according to claim 1, wherein said absolute position transformation means is provided with determination means for determining whether or not said bit pattern signal is a signal transformable into an absolute position with reference to a predetermined bit in said bit pattern signal.

4. An absolute encoder according to claim 1, wherein bit patterns corresponding to the bit pattern signals transformable in said absolute position transformation means are arranged substantially at equal intervals in the absolute pattern on said code plate.

5. An absolute encoder comprising:

a code plate formed with an absolute pattern in which one absolute position is represented by an n-bit signal (n is a natural number), the absolute pattern including a predetermined number P of minimum read units of absolute position ($2^{n-1} < P \leq 2^n$);

detecting means relatively moving with respect to said code plate, having (n+m) (where m is a natural number) detecting elements arranged to be opposed to said absolute pattern, and reading said absolute pattern to output an (n+m)-bit signal;

absolute position transformation means which can transform only specific n-bit pattern signals corresponding to specific n-bit patterns extracted from said (n+m)-bit signal into said absolute position;

signal extracting means for successively extracting n-bit signal from said (n+m)-bit signal output from said detecting means until said n-bit signal becomes said specific n-bit pattern signal transformable by said absolute position transformation means; and calculation means for calculating information indicating a position of said code plate relative to said detecting means, based on the absolute position obtained by said absolute position transformation means and a number of extractions executed by said signal extracting means.

6. An absolute encoder according to claim 5, wherein said signal extracting means extracts said n-bit signal according to the order of the arrangement of the n-bit patterns in said absolute pattern.

7. An absolute encoder according to claim 5, wherein the specific n-bit pattern signal transformable by said absolute position transformation means is a signal with two bits from the most significant being "00".

8. An absolute encoder according to claim 5, wherein the bit patterns corresponding to the bit pattern signals transformable in said absolute position transformation means are arranged substantially at equal intervals in the absolute pattern on said code plate.

9. An absolute encoder comprising:

a code plate formed with an absolute pattern including a plurality of bit patterns, each bit pattern consisting of a predetermined number of bits and representing one absolute position;

detecting means relatively moving with respect to said code plate, having a plurality of detecting elements arranged to be opposed to said predetermined number of bits, and reading said bit pattern from said absolute pattern to output a bit pattern signal representing said bit pattern;

absolute position transformation means which can transform only specific bit pattern signals corresponding to specific bit patterns out of a plurality of said bit pattern signals corresponding to said plurality of bit patterns, into said absolute positions;

relative position calculation means for calculating a relative, positional relation between the bit pattern corresponding to said bit pattern signal, read from said detecting means, and said specific bit pattern; and calculation means for calculating information indicating a position of said code plate relative to said detecting means, based on the absolute position obtained by said absolute position transformation means and the relative, positional relation obtained by said relative position calculating means.

10. A coding method for a code plate having an absolute pattern including a plurality of bit patterns, each bit pattern formed of a predetermined number of bits and representing one absolute position, comprising:

relatively moving the code plate and a detector, reading a detected one of the bit patterns and outputting a bit pattern signal representing the detected bit pattern;

successively changing the bit pattern signal until the bit pattern signal becomes a transformable bit pattern signal which corresponds to an absolute position and outputting the transformable bit pattern signal;

calculating a position of the code plate relative to the detector based on the absolute position obtained from the transformable bit pattern signal and a number of changes executed in said successive changing step.

11. A coding method for a code plate having an absolute pattern including a plurality of bit patterns, each bit pattern formed of a predetermined number of bits and representing one absolute position, comprising:

relatively moving the code plate and a detector, reading a detected one of the bit patterns and outputting a bit pattern signal representing the detected bit pattern;

calculating a relative, positional relation between the bit pattern corresponding to the detected bit pattern signal and a selected transformable bit pattern;

transforming the selected transformable bit pattern signal into an absolute position; and calculating a position of the code plate relative to the detector based on the transformed absolute position and the calculated relative, positional relation.

12. An absolute encoder comprising:

a code plate formed with an absolute pattern including a plurality of bit patterns, each bit pattern consisting of a predetermined number of bits and representing one absolute position;

a detector relatively moving with respect to said code plate, having a plurality of detecting elements arranged to be opposed to said predetermined number of bits, and reading said bit pattern from said absolute pattern to output a bit pattern signal representing said bit pattern;

a transformer to transform specific bit pattern signals corresponding to specific bit patterns at a plurality of said bit patterns signals corresponding to said plurality of bit patterns, into said absolute positions;

a relative position calculator to calculate a relative, positional relation between the bit pattern corresponding to said bit pattern signal, read from said detector, and said specific bit pattern; and a position calculator to calculate information indicating a position of said code plate relative to said detector, based on the absolute position obtained by said transformer and a relative, positional relation obtained by said relative position calculator.

* * * * *